United States Patent [19]

Grant et al.

[11] 4,215,927
[45] Aug. 5, 1980

[54] LITHOGRAPHIC PLATE PROCESSING APPARATUS

[75] Inventors: Clyde P. Grant, Gorham; Richard M. Lowe, South Portland, both of Me.

[73] Assignee: Scott Paper Company, Philadelphia, Pa.

[21] Appl. No.: 29,664

[22] Filed: Apr. 13, 1979

[51] Int. Cl.² .............................................. G03D 5/04
[52] U.S. Cl. .................................... 354/317; 354/325; 15/77; 118/109; 118/119; 118/314
[58] Field of Search ............... 354/297, 317, 318, 324, 354/325; 15/77, 102; 118/109, 110, 118, 119, 314, 326

[56] References Cited

U.S. PATENT DOCUMENTS

| | | | |
|---|---|---|---|
| 3,448,720 | 6/1969 | Graham | 118/110 |
| 3,682,079 | 8/1972 | Casson | 354/318 |
| 3,903,541 | 9/1975 | Meister et al. | 354/317 |
| 3,906,536 | 9/1975 | Graham | 354/297 |
| 3,916,426 | 10/1975 | Bown | 118/110 |
| 3,995,343 | 12/1976 | Horner | 15/102 |
| 4,142,194 | 2/1979 | Hamlin | 354/325 |

Primary Examiner—Michael L. Gellner
Assistant Examiner—Alan Mathews

[57] ABSTRACT

Disclosed is an improved lithographic plate processing apparatus which comprises means for moving an exposed lithographic plate through the apparatus on an uphill slope, developer means within the apparatus for applying a developer liquid to the plate as it moves through the apparatus, and gumming means within the apparatus for applying gum to the plate after it has been developed, the improvement comprising, as part of the developer means, second spray means for spraying fresh developer liquid on the plate at a position between two rotating scrub brushes, which in combination with the other elements of the developer means simultaneously provides washing of the dirty developer liquid from the plate and fresh developer on the plate as it is scrubbed by the second scrub brush.

1 Claim, 1 Drawing Figure

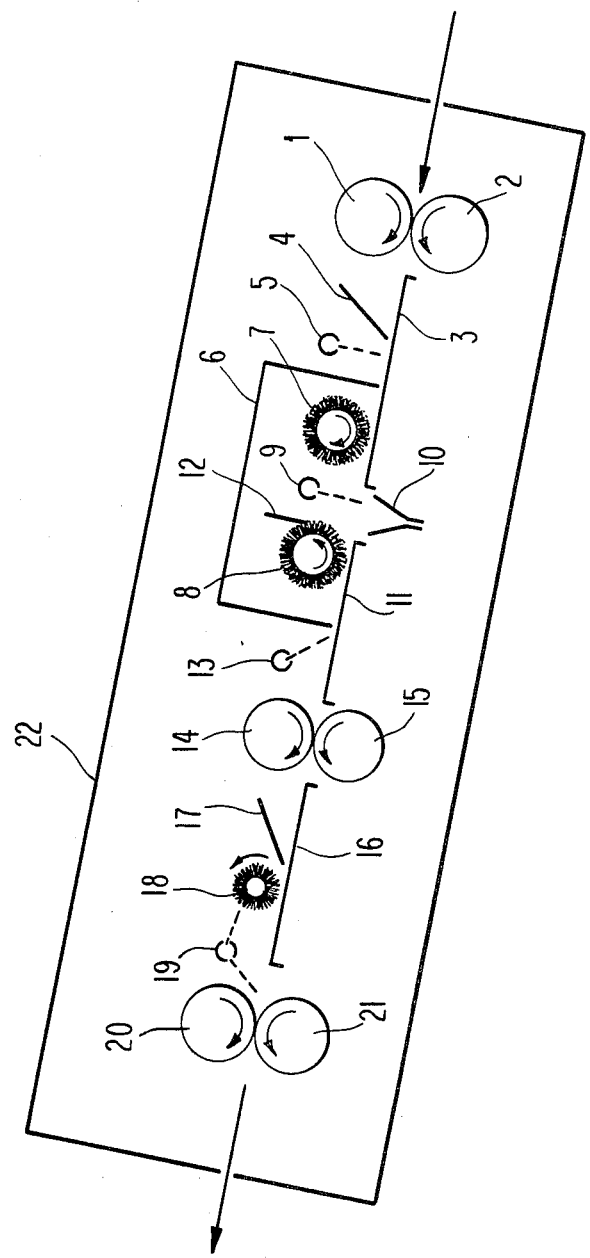

LITHOGRAPHIC PLATE PROCESSING APPARATUS

TECHNICAL FIELD

The present invention is an improved lithographic plate processing apparatus of the type which automatically develops and gums an exposed lithographic printing plate.

BACKGROUND ART

In the lithographic printing process, a lithographic plate comprising an aluminum sheet is initially coated with a photosensitive layer usually containing, among other things, one or more resins. A negative is applied over the photosensitive layer, and the two are exposed to high intensity light. The negative is then removed, and the plate is processed to develop it. In development, the image areas of the photosensitive layer are retained on the plate surface and the non-image areas are removed. Although some manual developing is still done, the large scale commerical use of lithographic plates has made automatic processing of necessity. Numerous apparatus have been proposed to perform such processes. In general, the more successful machines have emulated the manual development procedures by subjecting the plate to a scrubbing action while flooding the plate with developer liquid and then flooding the plate with gum arabic. However, there has always been need to improve the apparatus to perform tasks more satisfactorily.

In the developing step, the developer liquid becomes dirty as it removes the unimaged portions of the photosensitive coating. After the developer liquid becomes dirty, any further scrubbing or permitting the dirty developer liquid to remain on the plate can result in random redeposition of the removed coating material on the plate, causing obvious image defects in the developed plate. To avoid this, prior art apparatus typically remove the dirty developer liquid from the plate while scrubbing, or immediately thereafter, and reapply the developer liquid one or more times. The advantages of shortcutting this process can be easily appreciated.

DISCLOSURE OF THE INVENTION

It is an object of the invention to provide a improved lithographic plate processing apparatus in which the developing step is carried out more efficiently and with simpler apparatus than in the prior art.

This and other objects are provided by the present invention, which is an improvement in a lithographic plate processing apparatus which comprises means for moving an exposed lithographic plate through the apparatus on an uphill slope, developer means within the apparatus for applying a developer liquid to the plate as it moves through the apparatus, and gumming means within the apparatus for applying gum arabic or other plate finisher to the plate after it has been developed. The developer means includes a development enclosure through which the plate passes, a first scrub brush mounted inside the enclosure near the entrance on a horizontal axis for rotation in the direction of plate movement in scrubbing contact with the plate, first spray means for spraying developer liquid onto the exposed surface of the plate before it reaches the first scrub brush, a second scrub brush mounted inside the enclosure near the exit on a horizontal axis for rotation in the direction against the movement of the plate in scrubbing contact with the plate, a doctor blade engaging the second scrub brush for preventing developer liquid from being thrown forward by the rotation of the second scrub brush, and drainage means positioned beneath the enclosure between the first and second scrub brushes for removing dirty developer flowing from the plate. The improvement comprises, as part of the developer means, second spray means positioned within the enclosure and between the first and second scrub brushes for flowing clean developer liquid onto the exposed surface of the plate to simultaneously wash the dirty developer liquid from the plate and provide fresh developer on the plate as it is scrubbed by the second scrub brush.

This unique arrangement of the second spray means between the first and second scrub brush and with the drain means provides the advantages of being able to wash dirty developer liquid from the plate immediately after scrubbing by the first scrub brush while at the same time and with the same apparatus provides fresh development liquid to the plate to permit further development at the second scrub brush. In addition, there is no opportunity for the plate to dry before the second application of developer liquid. Therefore, contrary to the occurrence in some prior art apparatus there will not be any redeposition of removed coating material caused by drying the plate surface with a film of dirty developer liquid on it.

BRIEF DESCRIPTION OF THE DRAWING

The drawing is a cut-away side view of the apparatus of the present invention illustrated schematically.

BEST MODE FOR CARRYING OUT THE INVENTION

Referring to the drawing, the path of an exposed lithographic plate passing through the apparatus on a slight uphill slope is illustrated by the arrows. The plate is first gripped by a pair of rotating rubber covered feed rolls 1 and 2 and fed into the apparatus, where it slides over a support member 3 and under a flexible baffle member 4. Baffle member 4 acts as a seal to prevent developer fluid from draining back onto the pair of feed rolls 1 and 2.

Immediately beyond baffle member 4, the plate passes under first spray means provided by a spray bar 5, extending across the width of the plate, which sprays developer liquid onto the exposed surface of the plate. The plate then passes under a small opening into a development enclosure 6 where the plate is scrubbed by first and second rotating scrub brushes 7 and 8. The development enclosure confines the agitated developer liquid to the enclosed area. The first brush 7, provided by a hard bristle brush is mounted inside the enclosure 6 near the entrance and rotates about a horizontal axis in the direction of plate movement to provide adequate brushing pressure without catching the forward edge of the plate. The second brush 8, provided by a soft bristle brush, is mounted inside the enclosure 6 near the exit and rotates about a horizontal axis against the travel of the plate to provide a final cleaning station beyond which the "dirty" developer is not allowed to flow. This brush 8 has a doctor blade 12 to prevent dirty developer from being thrown forward.

Above the plate and between brushes 7 and 8 is the second spray means, provided by developer liquid spray bar 9 extending across the width of the plate.

Spray bar 9 flows fresh developer onto the exposed surface of the plate to wash dirty developer from the plate and provide fresh developer on the plate as it is scrubbed by the second scrub brush. A drain 10 is located beneath the path of travel of the plate and between brushes 7 and 8. Dirty developer fluid passes through drain 10 and is recirculated through filters (not shown).

After passing under brush 8, the plate slides along support member 11, passing through an opening in enclosure 6, and into the second pair of rotating rubber covered feed rolls 14 and 15. A disposable plush wiper member (not shown) is preferably positioned against feed roll 14 to maintain the roll in a clean condition. Just beyond the enclosure 6 is a spray nozzle 13 which applies a final application of fresh developer liquid to clean the plate.

The second pair of feed rolls 14 and 15 feed the plate into the gumming section where it passes over a support plate 16 and beneath a flexible baffle member 17. The baffle member 17 forms a seal to prevent the gum from flowing from the gumming section of the apparatus back against the second pair of feed rolls 14 and 15 or into the developing section. It also forms a dam against which a puddle of gum forms to assure overall coverage of the plate. Just beyond baffle member 17, the plate passes under a rotating nylon bristle brush roll which rotates in a direction against the movement of the plate.

The gum is applied by spray bar 19 extending across the width of the plate and spraying at the downstream end of the gumming section and onto the brush roll 18 to keep it wet with gum. The gum is sprayed on the downstream end of the gumming section to allow maximum contact time with the plate.

After gumming, the plate is fed into a third pair of rubber feed rolls 20 and 21 which push the plate from the apparatus. The apparatus includes an enclosure cover 22 to prevent loss of the developer liquid and gum arabic. A drying section may be added, if desired, to the end of the gumming section.

The feed rolls 1, 2, 14, 15, 20, and 21 and the developer scrub brushes 7 and 8, and the gumming brush 18 are all driven by either chain and sprocket or belt drive means (not shown). The pairs of feed rolls are spaced apart a distance less than the length of the plate so that one pair grips the plate before the preceding pair releases it. The uphill slope of the path of travel of the plate is preferably about 5°.

What is claimed is:

1. In a lithographic plate processing apparatus which comprises means for moving an exposed lithographic plate through the apparatus on an uphill slope, developer means within the apparatus for applying a developer liquid to the plate as it moves through the apparatus, and gumming means within the apparatus for applying gum to the plate after it has been developed, the developer means including a development enclosure through which the plate passes, a first scrub brush mounted inside the enclosure near the entrance on a horizontal axis for rotation in the direction of plate movement in scrubbing contact with the plate, first spray means for spraying developer liquid onto the exposed surface of the plate before it reaches the first scrub brush, a second scrub brush mounted inside the enclosure near the exit on a horizontal axis for rotation in the direction against the movement of the plate in scrubbing contact with the plate, a doctor blade engaging the second scrub brush for preventing developer liquid from being thrown forward by the rotation of the second scrub brush, and drainage means positioned beneath the enclosure between the first and second scrub brushes for removing dirty developer flowing from the plate, the improvement comprising, as part of the developer means, second spray means positioned within the enclosure and between the first and second scrub brushes for flowing clean developer liquid onto the exposed surface of the plate to simultaneously wash the dirty developer liquid from the plate and provide fresh developer on the plate as it is scrubbed by the second scrub brush.

* * * * *